(12) United States Patent
Cheng et al.

(10) Patent No.: US 8,339,178 B2
(45) Date of Patent: Dec. 25, 2012

(54) LEVEL SHIFTER AND RELATED APPARATUS

(75) Inventors: Yen-Cheng Cheng, Hsinchu (TW); Chien-Chun Huang, Hsinchu (TW)

(73) Assignee: Orise Technology Co., Ltd., Hsinchu (TW)

( * ) Notice: Subject to any disclaimer, the term of this patent is extended or adjusted under 35 U.S.C. 154(b) by 0 days.

(21) Appl. No.: 13/207,055

(22) Filed: Aug. 10, 2011

(65) Prior Publication Data

US 2012/0049924 A1   Mar. 1, 2012

(30) Foreign Application Priority Data

Aug. 25, 2010   (TW) .............................. 99128540 A

(51) Int. Cl.
*H03L 5/00*   (2006.01)

(52) U.S. Cl. .............. 327/333; 326/68; 326/80; 326/81; 365/189.11

(58) Field of Classification Search .................. 327/333; 326/68, 80, 81; 365/189.11
See application file for complete search history.

(56) References Cited

U.S. PATENT DOCUMENTS 5,438,543 A * 8/1995 Yoon ......................... 365/189.11

* cited by examiner

*Primary Examiner* — Lincoln Donovan
*Assistant Examiner* — Shikha Goyal
(74) *Attorney, Agent, or Firm* — WPAT PC; Justin King

(57) ABSTRACT

Level shifter and related apparatus are provided. The level shifter has first to sixth transistors, wherein drains of the first and the second transistors respectively are coupled to drains of the fifth and the sixth transistors as two output nodes of the level shifter, gates of the fifth and the sixth transistors are two input nodes of the level shifter. A source, a drain and a gate of the third transistor are respectively coupled to a gate of the first transistor, the drain of the sixth transistor and a first bias voltage, and a source, a drain and a gate of the fourth transistor are respectively coupled to a gate of the second transistor, the drain of the fifth transistor and a second bias voltage.

17 Claims, 7 Drawing Sheets

LEVEL SHIFTER AND RELATED APPARATUS

This application claims the benefit of Taiwan application Serial No. 99128540, filed Aug. 25, 2010, the subject matter of which is incorporated herein by reference.

FIELD OF THE INVENTION

The present invention relates to a level shifter and associated apparatus, and more particularly, to a level shifter and associated apparatus with effective reduction of layout area.

BACKGROUND OF THE INVENTION

Level shifters, which receive input signals with smaller signal range and correspondingly convert them to output signals with greater signal range, play important roles in interface circuits. For example, a source driver for driving a display panel, original internal control signals in the chip operate in a signal range between 0 and 2 volts. However, for driving sources of the display panel, a required output signal range expands to be between 0 and 5 volts. To convert between the two signal ranges, level shifters are adopted for converting input signals of 0 to 2 volts to output signals of 0 to 5 volts.

Please refer to FIG. 1 illustrating a prior art relating to level shifter 10. The level shifter 10 includes a pair of (p-channel MOS) transistors TP1, TP2 and another pair of (n-channel MOS) transistors TN1, TN2. An input signal IN is inverted to be another input signal INB, wherein the input signals IN and INB operates between voltages VPP and VSS. The level shifter 10 operates between voltages VGH and VSS, and respectively provides output signals OUT, OUTB from nodes n2 and n1 according to the input signals IN and INB, such that the output signals operate between the voltages VGH and VSS, i.e., a signal range of the output signals OUT and OUTB is expanded to be between the voltages VSS and the voltage VGH. Gates of the transistors TN1 and TN2 respectively receive the input signals IN and INB, and gates of the transistors TP1 and TP2 are respectively coupled to the nodes n2 and n1.

Operation of the level shifter 10 can be briefly describes as follows. When the input signal IN equals the voltage VPP, the input signal INB equals the voltage VSS. Therefore, the transistor TN1 turns on such that the output signal OUTB of the node n1 is kept at the voltage VSS, and the transistor TP2 is turned on so the output signal OUT of the node n2 is kept at the voltage VGH. In contrast, the transistor TN2 and TP1 are turned off.

When the input signal IN transits from the voltage VPP to the voltage VSS and the input signal INB transits from the voltage VSS to the voltage VPP, the transistor TN2 starts to conduct a current In to discharge the node n2, so the output signal OUT of the node n2 can be pulled down to the voltage VSS from the original voltage VGH. However, when the transistor TN2 starts to turn on, the transistor TP2 maintains original turned-on status to conduct a current Ip. Thus, in order to successfully pull down the output signal OUT to the voltage VSS, the current In conducted by the transistor TN2 has to compete against the current Ip conducted by the transistor TP2. Because a source-gate cross voltage of the transistor TP2 equals a voltage difference between the voltages VGH and VSS, and a gate-source cross voltage of the transistor TN2 only equals a voltage difference between the voltages VPP and VSS, the current Ip conducted by the transistor TP2 is quite large. To overcome the current Ip with a greater current In under a lower gate-source cross voltage of the transistor TN2, the level shifter 10 has to enlarge dimensions and layout area of the n-channel MOS transistor TN2 (and TN1), so the transistor TN2 (and TN1) can enhance current driving ability with greater aspect (W/L) ratio. Thus, layout area of the level shifter 10 can not be effectively reduced.

Furthermore, while the input signals transit, the great current conducted by the transistor TP1 induces greater, longer-lasting short-wired current during competition, and therefore characteristics, such as transient power consumption, of the prior art level shifter 10 are impacted.

SUMMARY OF THE INVENTION

An objective of the invention is providing a level shifter outputting a first output signal and a second output signal respectively from a first output node and a second output node according to a first input signal and a second input signal, wherein the first input signal and the second input signal operate between a first voltage and a common voltage, the first output signal and the second output signal operate between a second voltage and the common voltage, and the first voltage is between the second voltage and the common voltage. The level shifter includes a first transistor comprising a first drain, a first source and a first gate with the first source being coupled to the second voltage, a second transistor comprising a second drain, a second source and a second gate with the second source being coupled to the second voltage, a third transistor comprising a third drain, a third source and a third gate with the third source being coupled to the first gate, the third drain being coupled to the second output node, and the third gate being coupled to a first bias voltage, a fourth transistor comprising a fourth drain, a fourth source and a fourth gate with the fourth source being coupled to the second gate, the fourth drain being coupled to the first output node, and the fourth gate being coupled to a second bias voltage, a fifth transistor comprising a fifth drain, a fifth source and a fifth gate with the fifth drain being coupled to the first output node, the fifth source being coupled to the common voltage, and the fifth gate being coupled to the first input signal, and a sixth transistor comprising a sixth drain, a sixth source and a sixth gate with the sixth drain being coupled to the second output node, the sixth source being coupled to the common voltage, and the sixth gate being coupled to the second input signal. The first transistor and the second transistor are matched, the third transistor and the fourth transistor are matched, and the fifth transistor and the sixth transistor are matched. When the first input signal equals the first voltage, the fifth transistor conducts the common voltage to the first output node, the fourth transistor conducts to turn on the second transistor so the second voltage is conducted to the second output node, and the third transistor conducts the second output node to the first gate so the first transistor is turned off.

An objective of the invention is providing a level shift system, including a level shifter outputting a first output signal and a second output signal respectively from a first output node and a second output node according to a first input signal and a second input signal, wherein the first input signal and the second input signal operate between a first voltage and a common voltage, the first output signal and the second output signal operate between a second voltage and the common voltage, and the first voltage is between the second voltage and the common voltage. The level shifter includes a first transistor comprising a first drain, a first source and a first gate with the first source being coupled to the second voltage, a second transistor comprising a second drain, a second source and a second gate with the second source being coupled to the second voltage, a third transistor comprising a third drain, a third source and a third gate with the third source being coupled to the first gate, the third drain being coupled to the second output node, and the third gate being coupled to a first bias voltage, a fourth transistor comprising a fourth drain, a fourth source and a fourth gate with the fourth source being coupled to the second gate, the fourth drain being coupled to the first output node, and the fourth gate being coupled to a second bias voltage, a fifth transistor comprising a fifth drain, a fifth source and a fifth gate with the fifth drain being coupled to the first output node, the fifth source being coupled to the common voltage, and the fifth gate being coupled to the first input signal, and a sixth transistor comprising a sixth drain, a sixth source and a sixth gate with the sixth drain being coupled to the second output node, the sixth source being coupled to the common voltage, and the sixth gate being coupled to the second input signal. The level shift system further includes a bias voltage circuit for generating the first bias voltage and the second bias voltage, including a seventh transistor having a seventh drain, a seventh source and a seventh gate with the seventh source being coupled to the second voltage, the seventh gate being coupled to the third gate and the fourth gate, and the seventh drain being coupled to a current source and the seventh gate. The first transistor and the second transistor are matched, the third transistor and the fourth transistor are matched, and the fifth transistor and the sixth transistor are matched. When the first input signal equals the first voltage, the fifth transistor conducts the common voltage to the first output node, the fourth transistor conducts to turn on the second transistor so the second voltage is conducted to the second output node, and the third transistor conducts the second output node to the first gate so the first transistor is turned off.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
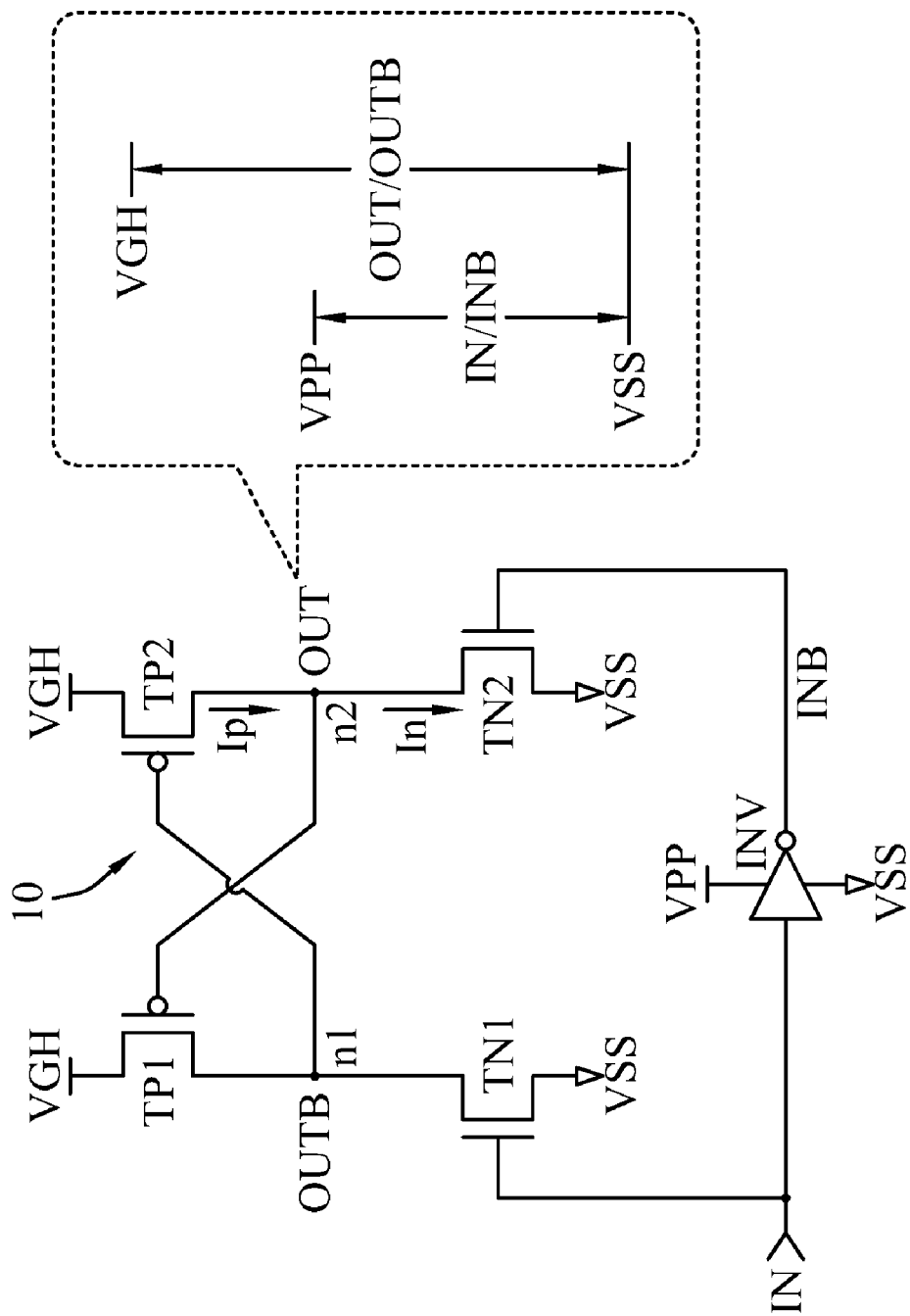
FIG. 1 (prior art) illustrates a prior art level shifter.
Figure 2:
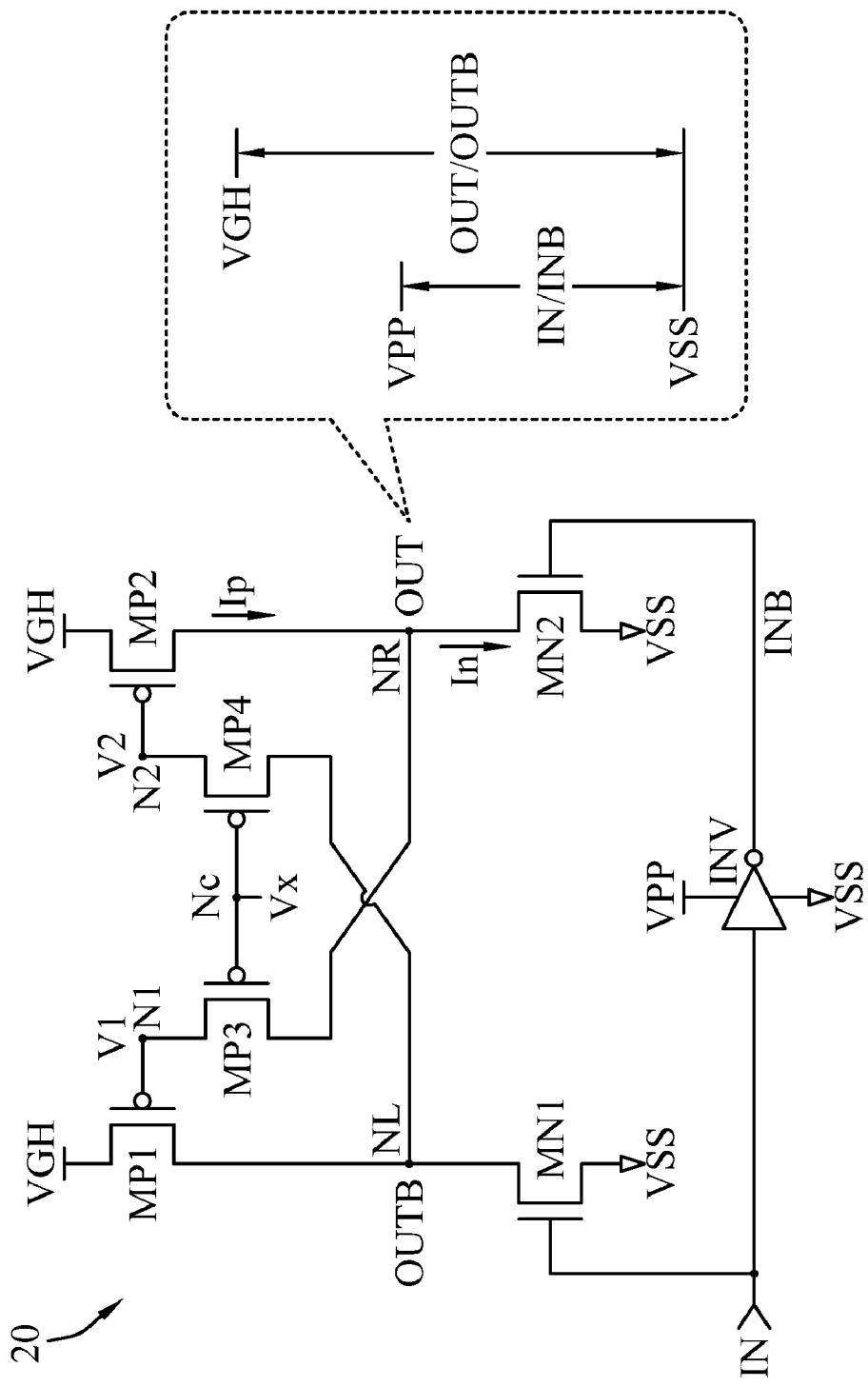
FIG. 2 illustrates a level shifter according to an embodiment of the invention.

Please refer to FIG. 2 illustrating a level shifter 20 according to an embodiment of the invention. The level shifter 20 includes a pair of mutually matched transistors MP1 and MP2, a pair of matched transistors MP3 and MP4, as well as another pair of matched transistors MN1 and MN2. An inverter INV inverts an input signal IN to another input signal INB, and two nodes NL and NR of the level shifter 20 are respectively regarded as two output nodes. According to the input signals IN and INB, the level shifter 20 performs level shift and outputs two corresponding differential output signals OUTB and OUT respectively from the nodes NL and NR. The input signals IN and INB operate between the voltages VPP and VSS, the output signals OUT and OUTB operate between the voltages VGH and VSS, and the voltage VPP is greater than the voltage VSS but less than the voltage VGH.

In the level shifter 20, the transistors MP1 and MP2 are p-channel MOS transistors, drains of both transistors are respectively coupled to the nodes NL and NR, and sources are commonly coupled to the voltage VGH. The transistors MP3 and MP4 are also p-channel MOS transistors with sources respectively coupled to gates of the transistors MP1 and MP2 at nodes N1 and N2, drains respectively coupled to the nodes NR and NL, and gates commonly coupled to a bias voltage Vx at a node Nc. The transistors MN1 and MN2 are n-channel MOS transistors with gates respectively coupled to the input signals IN and INB, drains respectively coupled to the nodes NL and NR, and sources commonly coupled to the voltage VSS.

In a preferred embodiment of the level shifter 20, the bias voltage Vx matches following bias voltage setting principle: (VGH−|VTHPa|−|VTHPb|)>Vx, and preferably, Vx>(VSS−|VTHPb|), where |VTHPa| is a threshold voltage absolute value of the transistor MP1 (and MP2), and |VTHPb| is a threshold voltage absolute value of the transistor MP3 (and MP4). That is, in the embodiment of FIG. 2, the bias voltage Vx can be set to the voltage VSS or a higher voltage, but within an upper bound, such that the voltage VGH is greater than a sum of the bias voltage Vx and the two threshold voltage absolute values |VTHPa| and |VTHPb|.

Operation of the level shifter 20 of the invention can be described as follows. When the input signal IN equals the voltage VPP, the input signal INB equals the voltage VSS. Therefore, the transistor MN1 turns on, the output signal OUTB of the node NL equals the voltage VSS, and the transistor MN2 is turned off, so the output signal OUT of the node NR is controlled by the transistor MP2. Because the gate bias voltage Vx of the transistor MP4 matched the aforementioned bias voltage setting principle, the transistor MP4 turns on to conduct, and a voltage V2 of the node N2 equals voltage (Vx+VSG4) which can be approximated by voltage (Vx+|VTHPb|), where the voltage VSG4 is a source-gate cross voltage of the transistor MP4. With aforementioned bias voltage setting principle, a voltage difference between the voltages VGH and V2 is still greater than the threshold voltage absolute value |VTHPa| of the transistor MP2, so the transistor MP2 also turns on and then keeps the output signal OUT of the node NR equal to the voltage VGH. On the other hand, the transistor MP3 also turns on and conducts the voltage of the node NR to the node N1, so the voltage V1 of the node N1 equals the voltage VGH, and therefore the transistor MP1 is turned off.

As described by the bias voltage setting principle of the invention, in a preferred embodiment of the invention, the bias voltage Vx can be set to be greater than voltage (VSS−|VTHPb|), such that the voltage V2 of the node N2 provided by the transistor MP4 is higher than the voltage VSS and can be approximated by voltage (Vx+|VTHPb|), and then the source-gate cross voltage of the transistor MP2 is reduced to constrain conduction of the transistor MP2.

When the input signal IN transits from the voltage VPP to the voltage VSS and the input signal INB transits from the voltage VSS to the voltage VPP, the transistor MN1 is turned off to stop conducting, and the transistor MN2 starts to conduct a current In to pull down the output signal OUT of the node NR from the original voltage VGH to the voltage VSS.

When the transistor MN2 starts to conduct, though the transistor MP2 is still conducting, its conduction is reduced by operation of the transistor MP4, and a current Ip conducted by the transistor MP2 is therefore lowered. In this way, the current In of the transistor MN2 does not to be too high for competing against the current Ip, and layout area of the transistor MN2 (and MN1) can be effectively reduced. As the transistor MN2 successfully pulls down the signal OUT to the voltage VSS, the voltage V1 approximates voltage (Vx+ |VTHPb|) by the turned-on transistor MP3, so the transistor MP1 is turned on to transit the output signal OUTB to the voltage VGH. The voltage VGH of the node NL is directly conducted to the node N2 by the transistor MP4, such that the voltage V2 equals the voltage VGH to ensure that the transistor MP2 is turned off.

From aforementioned discussion, it is understood that the transistors MP3 and MP4 control the gate voltages V1 and V2 of the transistor MP1 and MP2 by drain-to-source voltage transmission characteristics of p-channel MOS transistor. Taking the transistor MP4 as an example, when its drain is conducted to the voltage VGH at the node NL, the transistor MP4 directly conducts the voltage VGH to its source at the node N2, so the voltage V2 of the node N2 also equals the voltage VGH. On the other hand, when the node NL is of the lower voltage VSS, the transistor MP4 controls the voltage V2 according to the bias voltage Vx, such that the voltage V2 approaches voltage (Vx+|VTHPb|). As a result, the transistor MP4 can completely turn off the transistor MP2 with the voltage VGH, and can also constrain conduction of the transistor MP2 with voltage (Vx+|VTHPb|), thus layout area of the level shifter of the invention can be effectively reduced. Because the transistors MP3 and MP4 are utilized to provide voltage for the gates of the transistors MP1 and MP2, the transistors MP3 and MP4 do not need high current driving ability, and the transistors MP3 and MP4 do not have to be implemented with transistors of large dimensions and large layout area. In an embodiment of the invention, the transistors MP3 and MP4 are implemented following minimum dimensions allowed by manufacture design rules for layout area optimization.

Figure 3:
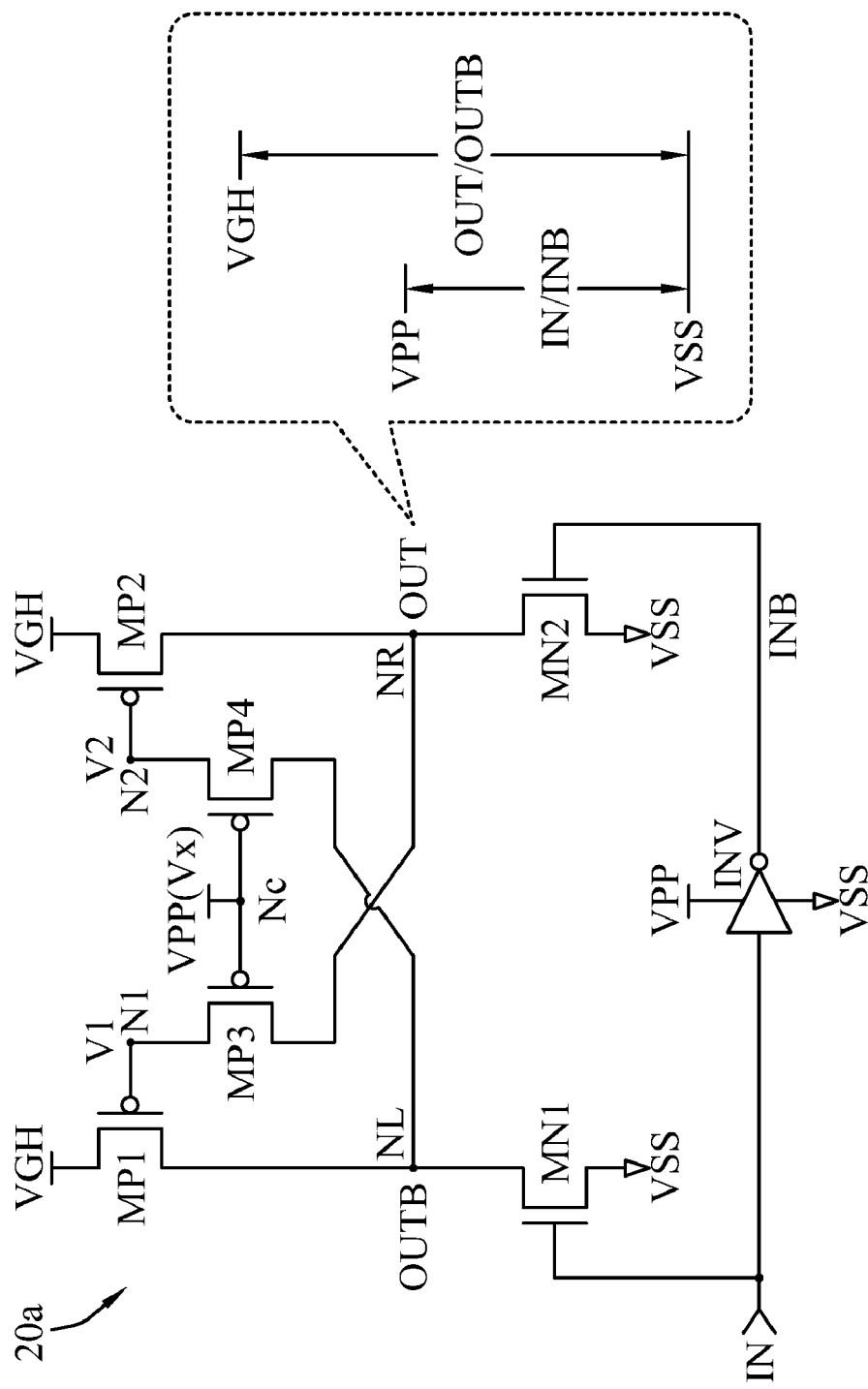
FIG. 3 to FIG. 5 illustrate various embodiments according to the level shifter of FIG. 2.
Figure 4:
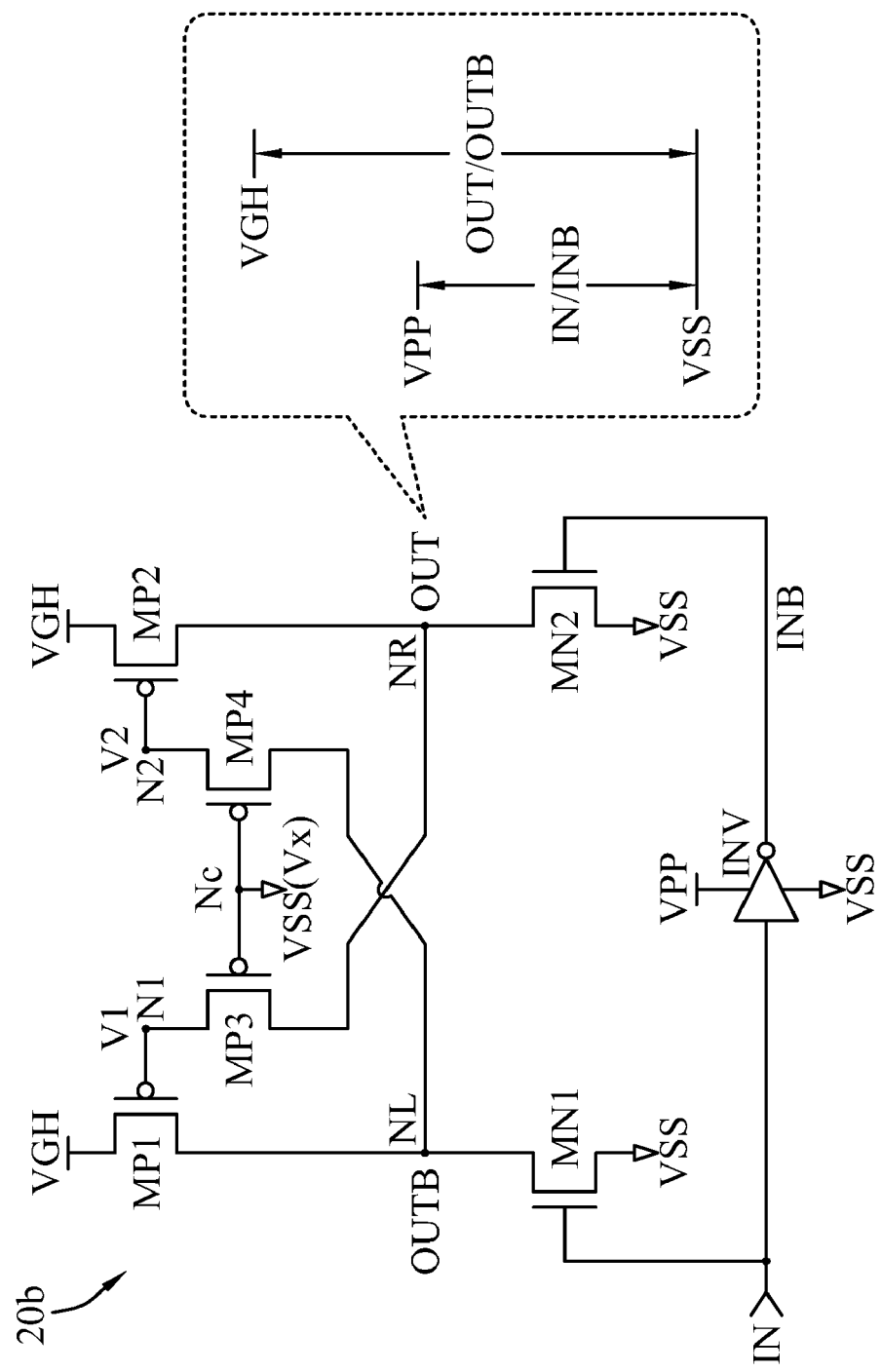
Figure 5:
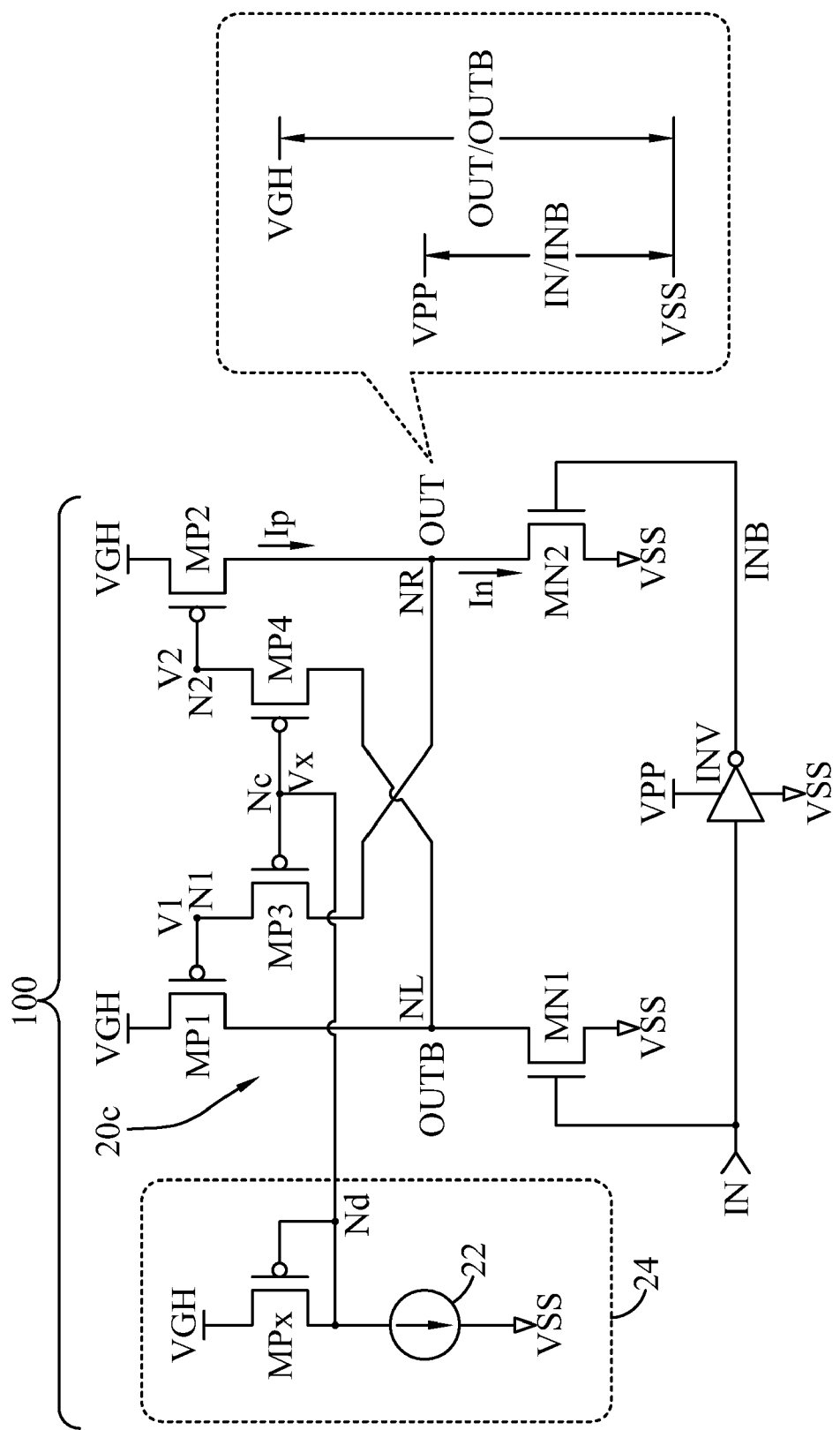

Three level shifters 20a, 20b and 20c respectively shown in FIG. 3, FIG. 4 and FIG. 5 can be derived from the level shifter 20 of FIG. 2. In the embodiment of FIG. 3, the node Nc of the level shifter 20a is coupled to the voltage VPP, i.e., the voltage VPP serves as the gate bias voltage Vx of the transistors MP3 and MP4. In some applications, a difference between the voltages VGH and VPP is greater than voltage (|VTHPb|+ |VTHPa|), so the voltage VPP can be used as the bias voltage Vx. In the embodiment of FIG. 4, the node Nc of the level shifter 20b is coupled to the voltage VSS so the bias voltage Vx equals the voltage VSS. Under such circumstance, a bottom bound of the voltages V1 and V2 is voltage (VSS+ |VTHPb|), so conduction of the transistors MP1 and MP2 can still be effectively constrained.

In FIG. 5, the level shifter 20c of the invention works in association with a bias voltage circuit 24 in a level shift system 100. The bias voltage circuit 24 provides the bias voltage Vx from the node Nd to the node Nc of the level shifter 20c. In this embodiment, the bias voltage circuit 24 includes a transistor MPx (e.g., a p-channel MOS transistor) having a source coupled to the voltage VGH, a drain coupled to a current source 22 (e.g., a constant current source or a variable current source), and a gate coupled to the node Nd with the drain. By controlling current of the current source 22 in the bias voltage circuit 24, the bias voltage Vx can be adjusted. For example, the current source 22 can build up a lower bias voltage Vx with a greater current. The level shift system 100 can includes multiple level shifters 20c which share a common bias voltage Vx provided by a single bias voltage circuit 24.

Figure 6:
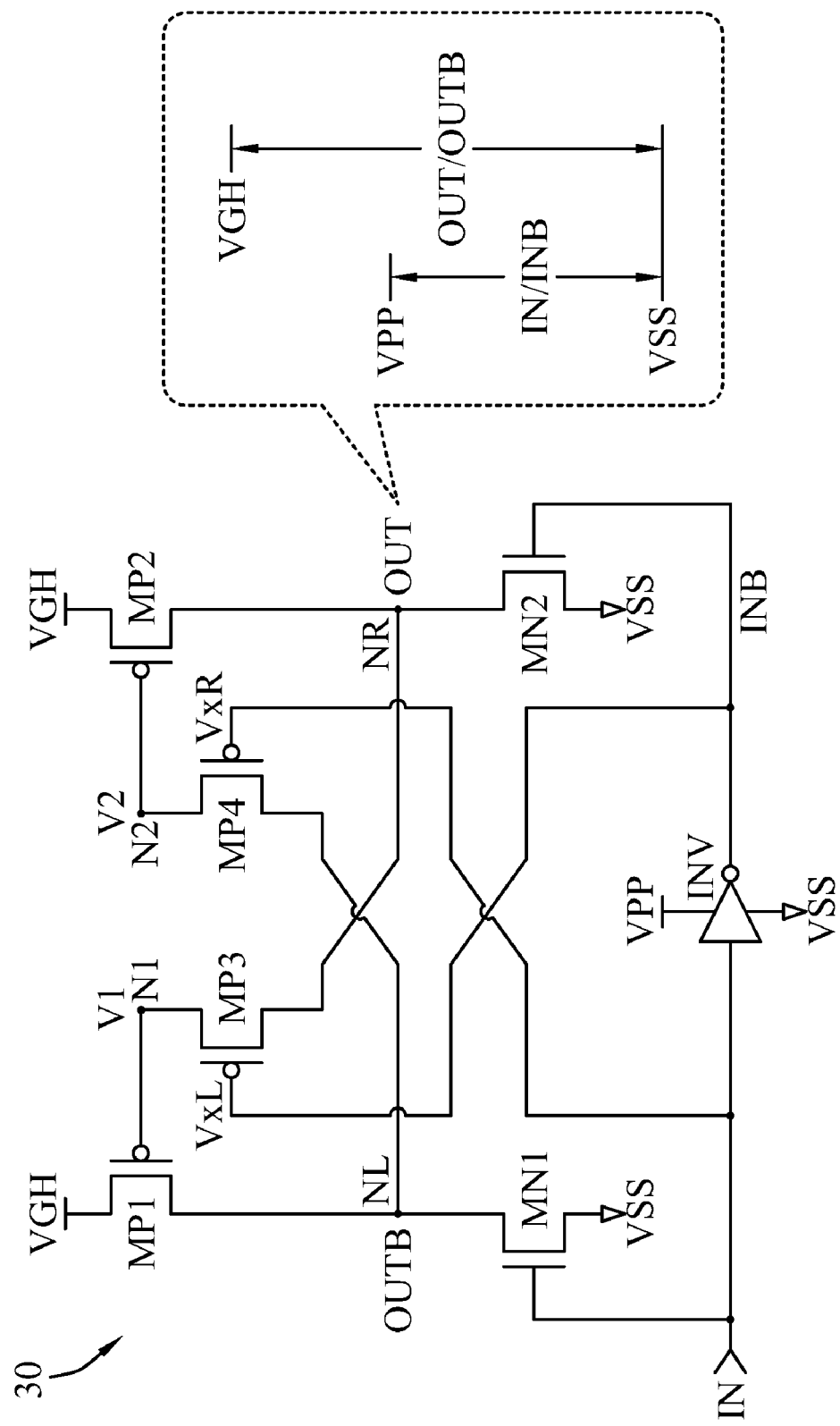
FIG. 6 illustrates a level shifter according to another embodiment of the invention.

Please refer to FIG. 6 illustrating a level shifter 30 according to an embodiment derived from the level shifter 20 of the invention. In the level shifter 30, a gate bias voltage VxL of the transistor MP3 equals the input signal INB, and a gate bias voltage VxR of the transistor MP4 is controlled by the input signal IN. Taking the transistor MP4 as an example, operation of the level shifter 30 can be described as follows. When the input signal IN equals the voltage VPP and the input signal INB equals the voltage VSS, the transistor MN1 turns on to conduct, the node NL is kept at the voltage VSS, and the transistor MP4 controls the voltage V2 according to the bias voltage VxR. Because the bias voltage VxR equals the voltage VPP of the input signal IN, the transistor MP2 turns on to keep the output signal OUT of the node NR at the voltage VGH if a voltage difference between the voltage VGH and the voltage VPP is greater than voltage (|VTHPb|+|VTHPa|). On the other hand, when the input signal IN equals the voltage VSS and the input signal INB equals the voltage VPP, the transistor MP1 is controlled to turn on by the transistor MP3 so as to keep the node NL at the voltage VGH, and the voltage V2 equals the voltage VGH by the transistor MP4 to turn off the transistor MP2, thus the node NR is kept at the voltage VSS by the turned-on transistor MN2.

Figure 7:
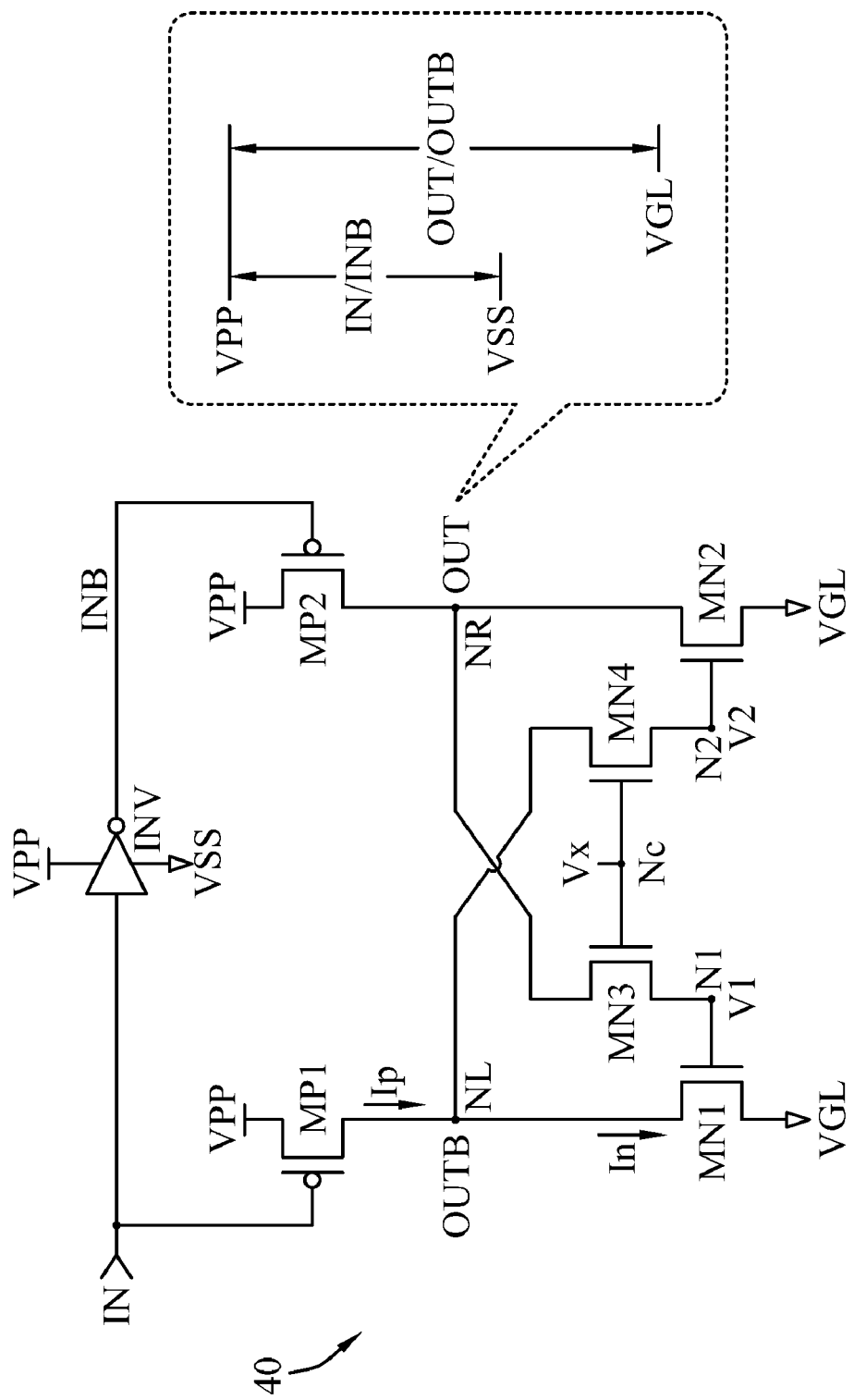
FIG. 7 illustrates a level shifter according to still another embodiment of the invention.

Please refer to FIG. 7 illustrating a level shifter 40 according to another embodiment of the invention. The level shifter 40 includes a pair of transistors MN1 and MN2, a pair of transistors MN3 and MN4 and another pair of transistors MP1 and MP2. An inverter INV inverts an input signal IN to another input signal INB. As two nodes NL and NR are two output nodes of the level shifter 40, the level shifter 40 performs level shift according to the input signals IN and INB, and outputs two differential output signals OUTB and OUT respectively from the nodes NL and NR. The input signals IN and INB operate between voltages VPP and VSS, the output signals OUT and OUTB operate between voltages VPP and VGL, and the voltage VSS is less than the voltage VPP and is between the voltages VPP and VGL. In this kind of level shifter, if conduction of the transistors MN1 and MN2 is too high, various negative impacts are induced, such as layout area of the transistors MP1 and MP2 have to be increased to enhance their current driving abilities. Therefore, the level shifter 40 of the invention will constrain conduction of the transistors MN1 and MN2 for effective reduction of layout area of such kind of level shifters.

In the level shifter 40, the transistors MN1 and MN2 are matched n-channel MOS transistors, drains of both transistors are respectively coupled to the nodes NL and NR, and sources are commonly coupled to the voltage VGL. The transistors MN3 and MN4 are also n-channel MOS transistors with sources respectively coupled to gates of the transistors MN1 and MN2 at nodes N1 and N2, drains respectively coupled to the nodes NR and NL, and gates commonly coupled to a bias voltage Vx at a node Nc. The transistors MP1 and MP2 are mutually matched p-channel MOS transistors with gates respectively coupled to the input signals IN and INB, drains respectively coupled to the node NL and NR, and sources commonly coupled to the voltage VPP.

In a preferred embodiment of the level shifter 40, the bias voltage Vx matches following bias voltage setting principle: Vx>(VGL+|VTHNa|+|VTHNb|), and preferably, Vx< (VPP+|VTHNb|), where |VTHNa| is a threshold voltage absolute value of the transistor MN1 (and MN2), and |VTHNb| is a threshold voltage absolute value of the transistor MN3 (and MN4). That is, in the embodiment of FIG. 7, the bias voltage Vx can be set to the voltage VPP or a lower voltage, but within a bottom bound, such that the bias voltage Vx is greater than a sum of the voltage VGL and the two threshold voltage absolute values |VTHNa| and |VTHNb|.

Operation of the level shifter 40 of the invention can be described as follows. When the input signal IN equals the voltage VPP, the input signal INB equals the voltage VSS. Therefore, the transistor MP2 turns on, the output signal OUT of the node NR equals the voltage VPP, and the transistor MP1 is turned off, so the output signal OUTB of the node NL is controlled by the transistor MN1. Because the gate bias voltage Vx of the transistor MN3 matched the aforementioned bias voltage setting principle for the level shifter 40, the transistor MN3 turns on to conduct, and a voltage V1 of the node N1 equals voltage (Vx−VGS3) which can be approximated by voltage (Vx−|VTHNb|), where the voltage VGS3 is a gate-source cross voltage of the transistor MN3. With aforementioned bias voltage setting principle for the level shifter 40, a voltage difference between the voltages V1 and VGL is still greater than the threshold voltage absolute value |VTHNa| of the transistor MN1, so the transistor MN1 also turns on and then keeps the output signal OUTB at the voltage VGL. On the other hand, the transistor MN4 also turns on and conducts the voltage of the node NL to the node N2, so the voltage V2 of the node N2 equals the voltage VGL, and therefore the transistor MN2 is turned off.

As described by the bias voltage setting principle for the level shifter 40 of the invention, in a preferred embodiment, the bias voltage Vx can be set to be less than a voltage (VPP+|VTHNb|), such that the voltage V1 of the node N1 supported by the transistor MN3 is less than the voltage VPP (as the voltage V1 can be approximated by a voltage (Vx−|VTHNb|), and then the gate-source cross voltage of the transistor MN1 is reduced to constrain conduction of the transistor MN1.

When the input signal IN transits from the voltage VPP to the voltage VSS and the input signal INB transits from the voltage VSS to the voltage VPP, the transistor MP2 is turned off to stop conducting, and the transistor MP1 starts to conduct a current Ip to pull up the output signal OUTB of the node NL from the original voltage VGL to the voltage VPP. When the transistor MP1 starts to conduct, though the transistor MN1 is still conducting, its conduction is reduced by operation of the transistor MN3, and a current In conducted by the transistor MN1 is therefore lowered. In this way, the current Ip of the transistor MP1 does not to be too high for competing against the current In, and layout area of the transistor MP1 (and MP2) can be effectively reduced. As the transistor MP1 successfully pull up the signal OUTB to the voltage VPP, the voltage V2 approximates voltage (Vx−|VTHNb|) by the turned-on transistor MN4, so the transistor MN2 is turned on to transit the output signal OUT to the voltage VGL. The voltage VGL of the node NR is directly conducted to the node N1 by the transistor MN3, such that the voltage V1 equals the voltage VGL to ensure turn-off of the transistor MN1.

Embodiments of the level shifters 20a, 20b and 20c can be derived from the level shifter 20 of the invention, and various analogous embodiments of the level shifter 40 can be also derived similarly.

To sum up, comparing to the prior art, the level shifters of the invention can properly limit conduction of transistors to effectively reduce layout area of level shifters, also can avoid extremely great transient current due to high conduction.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A level shifter, outputting a first output signal and a second output signal respectively from a first output node and a second output node according to a first input signal and a second input signal, wherein the first input signal and the second input signal operate between a first voltage and a common voltage, the first output signal and the second output signal operate between a second voltage and the common voltage, and the first voltage is between the second voltage and the common voltage, the level shifter comprising:
    a first transistor, comprising a first drain, a first source and a first gate, and the first source being coupled to the second voltage,
    a second transistor, comprising a second drain, a second source and a second gate, and the second source being coupled to the second voltage,
    a third transistor, comprising a third drain, a third source and a third gate, the third source being coupled to the first gate, the third drain being coupled to the second output node, and the third gate being coupled to a first bias voltage,
    a fourth transistor, comprising a fourth drain, a fourth source and a fourth gate, the fourth source being coupled to the second gate, the fourth drain being coupled to the first output node, and the fourth gate being coupled to a second bias voltage,
    a fifth transistor, comprising a fifth drain, a fifth source and a fifth gate, the fifth drain being coupled to the first output node, the fifth source being coupled to the common voltage, and the fifth gate being coupled to the first input signal, and
    a sixth transistor, comprising a sixth drain, a sixth source and a sixth gate, the sixth drain being coupled to the second output node, the sixth source being coupled to the common voltage, and the sixth gate being coupled to the second input signal,
    wherein the first transistor and the second transistor are matched, the third transistor and the fourth transistor are matched, and the fifth transistor and the sixth transistor are matched, and
    when the first input signal equals the first voltage, the fifth transistor conducts the common voltage to the first output node, the fourth transistor conducts to turn on the second transistor so the second voltage is conducted to the second output node, and the third transistor conducts the second output node to the first gate so the first transistor is turned off.

2. The level shifter as claimed in claim 1, wherein the first bias voltage, the second bias voltage and the first voltage are equal.

3. The level shifter as claimed in claim 1, wherein the first bias voltage, the second bias voltage and the common voltage are equal.

4. The level shifter as claimed in claim 1, wherein the first transistor and the third transistor are p-channel MOS (Metal-Oxide-Semiconductor) transistors, the fifth transistor is an n-channel MOS transistor, and the first voltage is greater than the common voltage.

5. The level shifter as claimed in claim 4, wherein the first transistor has a first threshold voltage absolute value, and the third transistor has a third threshold voltage absolute value, the first bias voltage equals the second bias voltage, and the second voltage is greater than a sum of the first bias voltage, the first threshold voltage absolute value and the third threshold voltage absolute value.

6. The level shifter as claimed in claim 5, wherein when the third drain is conducted to the second voltage, the third transistor conducts the second voltage to the third source, and when the third drain is conducted to the common voltage, the third transistor controls a voltage of the third source according to the first bias voltage and the third threshold voltage absolute value.

7. The level shifter as claimed in claim 1, wherein the first transistor and the third transistor are n-channel MOS transistors, the fifth transistor is a p-channel transistor, and the first voltage is less than the common voltage.

8. The level shifter as claimed in claim 7, wherein the first transistor has a first threshold voltage absolute value, and the third transistor has a third threshold voltage absolute value, the first bias voltage equals the second bias voltage, and the first bias voltage is greater than a sum of the second voltage, the first threshold voltage absolute value and the third threshold voltage absolute value.

9. The level shifter as claimed in claim 8, wherein when the third drain is conducted to the second voltage, the third transistor conducts the second voltage to the third source, and when the third drain is conducted to the common voltage, the third transistor controls a voltage of the third source according to the first bias voltage and the third threshold voltage absolute value.

10. The level shifter as claimed in claim 1, wherein the first bias voltage is the second input signal, and the second bias voltage is the first input signal.

11. A level shift system, comprising:
a level shifter, outputting a first output signal and a second output signal respectively from a first output node and a second output node according to a first input signal and a second input signal, wherein the first input signal and the second input signal operate between a first voltage and a common voltage, the first output signal and the second output signal operate between a second voltage and the common voltage, and the first voltage is between the second voltage and the common voltage, the level shifter further comprising:
a first transistor, comprising a first drain, a first source and a first gate, and the first source being coupled to the second voltage,
a second transistor, comprising a second drain, a second source and a second gate, and the second source being coupled to the second voltage,
a third transistor, comprising a third drain, a third source and a third gate, the third source being coupled to the first gate, the third drain being coupled to the second output node, and the third gate being coupled to a first bias voltage,
a fourth transistor, comprising a fourth drain, a fourth source and a fourth gate, the fourth source being coupled to the second gate, the fourth drain being coupled to the first output node, and the fourth gate being coupled to a second bias voltage,
a fifth transistor, comprising a fifth drain, a fifth source and a fifth gate, the fifth drain being coupled to the first output node, the fifth source being coupled to the common voltage, and the fifth gate being coupled to the first input signal, and
a sixth transistor, comprising a sixth drain, a sixth source and a sixth gate, the sixth drain being coupled to the second output node, the sixth source being coupled to the common voltage, and the sixth gate being coupled to the second input signal, and
a bias voltage circuit, comprising a seventh transistor having a seventh drain, a seventh source and a seventh gate, for generating the first bias voltage and the second bias voltage, wherein the seventh source being coupled to the second voltage, the seventh gate being coupled to the third gate and the fourth gate, the seventh drain being coupled to a current source, and the seventh gate being coupled to the seventh drain,
wherein the first transistor and the second transistor are matched, the third transistor and the fourth transistor are matched, and the fifth transistor and the sixth transistor are matched, and
when the first input signal equals the first voltage, the fifth transistor conducts the common voltage to the first output node, the fourth transistor conducts to turn on the second transistor so the second voltage is conducted to the second output node, and the third transistor conducts the second output node to the first gate so the first transistor is turned off.

12. The level shift system as claimed in claim 11, wherein the first transistor and the third transistor are p-channel MOS transistors, the fifth transistor is an n-channel MOS transistor, and the first voltage is greater than the common voltage.

13. The level shift system as claimed in claim 12, wherein the first transistor has a first threshold voltage absolute value, and the third transistor has a third threshold voltage absolute value, the first bias voltage equals the second bias voltage, and the second voltage is greater than a sum of the first bias voltage, the first threshold voltage absolute value and the third threshold voltage absolute value.

14. The level shift system as claimed in claim 13, wherein when the third drain is conducted to the second voltage, the third transistor conducts the second voltage to the third source, and when the third drain is conducted to the common voltage, the third transistor controls a voltage of the third source according to the first bias voltage and the third threshold voltage absolute value.

15. The level shift system as claimed in claim 11, wherein the first transistor and the third transistor are n-channel MOS transistors, the fifth transistor is a p-channel transistor, and the first voltage is less than the common voltage.

16. The level shift system as claimed in claim 15, wherein the first transistor has a first threshold voltage absolute value, and the third transistor has a third threshold voltage absolute value, the first bias voltage equals the second bias voltage, and the first bias voltage is greater than a sum of the second voltage, the first threshold voltage absolute value and the third threshold voltage absolute value.

17. The level shift system as claimed in claim 16, wherein when the third drain is conducted to the second voltage, the third transistor conducts the second voltage to the third source, and when the third drain is conducted to the common voltage, the third transistor controls a voltage of the third source according to the first bias voltage and the third threshold voltage absolute value.

* * * * *